US009325315B2

United States Patent
Wu et al.

(10) Patent No.: US 9,325,315 B2
(45) Date of Patent: Apr. 26, 2016

(54) NAND GATE CIRCUIT, DISPLAY BACK PLATE, DISPLAY DEVICE AND ELECTRONIC DEVICE

(71) Applicant: BOE TECHNOLOGY GROUP CO., LTD., Beijing (CN)

(72) Inventors: Zhongyuan Wu, Beijing (CN); Danna Song, Beijing (CN); Liye Duan, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 14/420,880

(22) PCT Filed: Aug. 5, 2014

(86) PCT No.: PCT/CN2014/083725
§ 371 (c)(1),
(2) Date: Feb. 10, 2015

(87) PCT Pub. No.: WO2015/070647
PCT Pub. Date: May 21, 2015

(65) Prior Publication Data
US 2016/0028398 A1 Jan. 28, 2016

(30) Foreign Application Priority Data

Nov. 15, 2013 (CN) .......................... 2013 1 0573352

(51) Int. Cl.
*H03K 19/094* (2006.01)
*H03K 19/20* (2006.01)
(Continued)

(52) U.S. Cl.
CPC .. *H03K 19/018507* (2013.01); *H03K 19/09441* (2013.01); *H03K 19/09445* (2013.01); *H03K 19/20* (2013.01)

(58) Field of Classification Search
CPC ...... H03K 3/012; H03K 19/094; H03K 19/20
USPC ......................................... 326/120, 119, 112
See application file for complete search history.

(56) References Cited

U.S. PATENT DOCUMENTS

| 6,392,486 | B1 | 5/2002 | Lemay, Jr. | |
|---|---|---|---|---|
| 7,061,279 | B1 | 6/2006 | Leete | |
| 2008/0315918 | A1* | 12/2008 | Luo | H03K 19/09441 326/80 |
| 2012/0242370 | A1* | 9/2012 | Park | H03K 19/20 326/112 |

FOREIGN PATENT DOCUMENTS

| CN | 1499722 A | 5/2004 |
|---|---|---|
| CN | 1835402 A | 9/2006 |

(Continued)

OTHER PUBLICATIONS

International Search Report and Written Opinion regarding PCT/CN2014/083725 mailed Aug. 5, 2014.
(Continued)

*Primary Examiner* — Daniel D Chang
(74) *Attorney, Agent, or Firm* — Harness, Dickey & Pierce, P.L.C.

(57) ABSTRACT

The NAND gate circuit includes at least two input transistors, at least two pull-up modules and at least two input control transistors. A first electrode of each input transistor is connected to a second level output end via the pull-up module. The input control transistor is configured to enable a potential of the control end of the pull-up module connected to the first electrode of the input transistor to be the first level when the input signal connected to the gate electrode of the input control transistor is at a second level. The at least two pull-up modules are configured to cut off the connection between the second level output end and the NAND gate output end when all the input signals are at the second level, and enable the connection therebetween when none of the input signals is at the second level.

20 Claims, 2 Drawing Sheets

(51) Int. Cl.
*H03K 3/012* (2006.01)
*H03K 19/0185* (2006.01)
*H03K 19/0944* (2006.01)

(56) References Cited

FOREIGN PATENT DOCUMENTS

| CN | 101354924 A | 1/2009 |
| CN | 101547004 A | 9/2009 |
| CN | 103226927 A | 7/2013 |
| CN | 103560782 A | 2/2014 |
| JP | 2010098666 A | 4/2010 |

OTHER PUBLICATIONS

First Chinese Office Action mailed Oct. 11, 2014 regarding Chinese Application No. 201310573352.1. Translation provided by Dragon Intellectual Property Law Firm.

* cited by examiner

US 9,325,315 B2

NAND GATE CIRCUIT, DISPLAY BACK PLATE, DISPLAY DEVICE AND ELECTRONIC DEVICE

CROSS-REFERENCE TO RELATED APPLICATIONS

This application is the U.S. national phase of PCT Application No. PCT/CN2014/083725 filed on Aug. 5, 2014, which claims a priority of the Chinese patent application No. 201310573352.1 filed on Nov. 15, 2013, which is incorporated herein by reference in its entirety.

TECHNICAL FIELD

The present disclosure relates to the field of display technology, in particular to an NAND gate circuit, a display back plate, a display device and an electronic device.

BACKGROUND

Currently, there are various processes for manufacturing a back plate of a display device, e.g., an a-Si TFT (thin film transistor) display device, a LTPS (low temperature poly-silicon) TFT display device, or an oxide TFT display device. An a-Si TFT has such drawbacks as low migration rate and poor stability, while an LTPS TFT is not adapted to the manufacture of a large-size panel. In addition, an oxide TFT usually has a depleted I-V transfer characteristic, i.e., the oxide TFT remains in an on state when its gate-to-source voltage Vgs is zero.

The depleted TFT renders a great difficulty in a design of circuits integrated in the back plate. An NAND gate is a logic circuit commonly used for digital circuits. For the two-input NAND gate, when two input signals are both at a high level, an output signal is at a low level, and when merely one input signal is at a high level and the other one is at a low level, the output signal is at a high level. As shown in FIG. 1, a commonly-used NAND gate circuit mainly consists of CMOS (complementary metal oxide semiconductor) circuits, in which two N-type TFTs for providing the input signals are connected in series and two P-type TFTs for providing the input signals are connected in parallel. In FIG. 1, A represents a first input signal, B represents a second input signal, Out represents an output signal, VDD represents a high level, and VSS represents a low level. The CMOS circuit has such advantages as small leakage current and low power consumption. For a process related to a TFT such as the oxide TFT, usually, merely one type of TFT, e.g., an N-type TFT, is used, so large leakage current and large static power consumption occur when designing a logic gate.

As shown in FIG. 2, which is a circuit diagram of the NAND gate using the N-type TFT, T1, T2 and T3 represent a first N-type TFT, a second N-type TFT and a third N-type TFT, respectively, IN1 and IN2 represent the first input signal and the second input signal, respectively, OUT represents the output signal, VDD represents the high level and VSS represents the low level. T3 works as a diode and functions as a pull-up resistor. When IN1 and IN2 are at a high level, T1 and T2 are turned on simultaneously so as to pull down OUT. However, T3 remains in the on state all the time, so there is a DC path from VDD to VSS. Meanwhile, an output low level is determined by the voltage division of series resistances between T3 and T1 as well as T2, and thus it cannot reach the low level VSS. When one or two of IN1 and IN2 are at the low level, T1 and T2 are cut off. Because T3 works as the diode, OUT is equal to VDD-VTH (a threshold voltage of T3). At this time, OUT cannot reach the high level VDD either. As mentioned above, an NAND gate of a traditional NMOS (N-metal-oxide-semiconductor) structure also has a large leakage current, and cannot be used to achieve a rail-to-rail output.

SUMMARY

A main object of the present disclosure is to provide an NAND gate circuit, a display back plate, a display device, and an electronic device, so as to achieve lossless transmission and a rail-to-rail output via an NAND gate when an input TFT is a depleted TFT.

In one aspect, the present disclosure provides an NAND gate circuit, including at least two input transistors, a gate electrode of each input transistor being connected to an input signal, a first electrode of a first input transistor being connected to an NAND gate output end, a second electrode of a last input transistor being connected to a first level, and apart from the last input transistor, a second electrode of each input transistor being connected to a first electrode of a next input transistor, wherein the NAND gate circuit further includes at least two pull-up modules and at least two input control transistors, a gate electrode of each input control transistor is connected to the input signal, a first electrode thereof is connected to a control end of the corresponding pull-up module, and a second electrode thereof is connected to the first level, the first electrode of the first input transistor is connected to a second level output end via the pull-up module, the input control transistor is configured to enable a potential of the control end of the pull-up module connected to the first electrode of the input transistor to be the first level when the input signal connected to the gate electrode of the input control transistor is at a second level, and the at least two pull-up modules are configured to cut off the connection between the second level output end and the NAND gate output end when all the input signals are at the second level, and enable the connection between the second level output end and the NAND gate output end when none of the input signals is at the second level.

In one embodiment, the at least two input transistors and the at least two input control transistors are all depleted NMOS transistors, the first electrode is a source electrode, the second electrode is a drain electrode, the second level is a high level, and the first level is a low level.

In one embodiment, the at least two input transistors and the at least two input control transistors are all depleted PMOS transistors, the first electrode is a drain electrode, the second electrode is a source electrode, the second level is a low level, and the first level is a high level.

In one embodiment, the pull-up module includes a first pull-up transistor, a second pull-up transistor and a storage capacitor, wherein a gate electrode of the second pull-up transistor is the control end of the pull-up module, a gate electrode of the first pull-up transistor is connected to the second level output end, a first electrode of the first pull-up transistor is connected to the gate electrode of the first pull-up transistor, and a second electrode of the first pull-up transistor is connected to the gate electrode of the second pull-up transistor, a first electrode of the second pull-up transistor is connected to the second level output end, and a second electrode thereof is connected to the NAND gate output end, and the storage capacitor is connected between the gate electrode and the second electrode of the second pull-up transistor.

During the implementation, when the input transistors and the input control transistors are all depleted NMOS transistors, the first pull-up transistor and the second pull-up transistor are both depleted NMOS transistors.

During the implementation, when the input transistors and the input control transistors are all depleted PMOS transistors, the first pull-up transistor and the second pull-up transistor are both depleted PMOS transistors.

In another aspect, the present disclosure provides a display back plate including the above-mentioned NAND gate circuit.

In yet another aspect, the present disclosure provides a display device including the above-mentioned display back plate.

In still yet another aspect, the present disclosure provides an electronic device including the above-mentioned NAND gate circuit.

As compared with the prior art, according to the NAND gate circuit, the display back plate, the display device and the electronic device of the present disclosure, the input control transistors and the pull-up modules are adopted so as to ensure lossless transmission and rail-to-rail output via the NAND gate when the input transistors are depleted TFTs, thereby to reduce the leakage current as well as improve the stability and speed of the NAND gate circuit.

DETAILED DESCRIPTION

Figure 1:
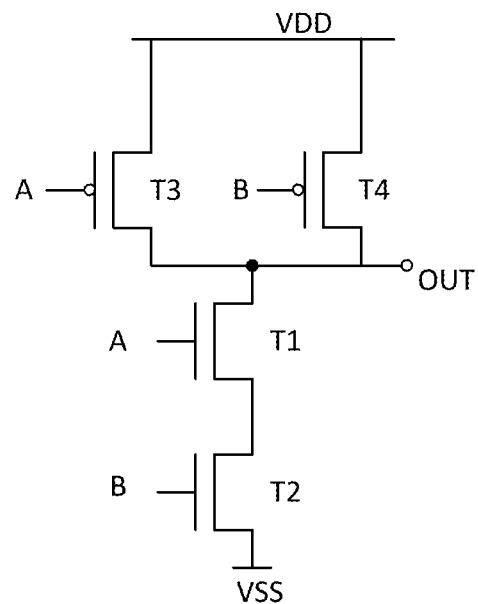
FIG. 1 is a circuit diagram of an existing NAND gate circuit consisting of CMOS circuits.

The technical solutions of the present disclosure will be descried hereinafter in a clear and complete manner in conjunction with the drawings and embodiments. Obviously, the following embodiments are merely a part of, rather than all of, the embodiments of the present disclosure, and based on them, a person skilled in the art may obtain the other embodiments without any creative effort, which also fall within the scope of the present disclosure.

For a TFT adopted in all embodiments of the present disclosure, its source electrode is symmetric with its drain electrode, so there is no difference therebetween. In the embodiments of the present disclosure, apart from a gate electrode, one electrode of the TFT is called as source electrode while the other is called as drain electrode, so as to differentiate them from each other. In addition, on the basis of characteristics of a PET, the transistors may be divided into NMOS transistors and PMOS transistors. In an AMOLED pixel circuit provided in the embodiments of the present disclosure, the NMOS transistor is taken as an example. Obviously, the PMOS transistor may also be used, and they also fall within the scope of the present disclosure.

An NAND gate circuit of the present disclosure includes at least two input transistors. A gate electrode of each input transistor is connected to an input signal, a first electrode of a first input transistor is connected to an NAND gate output end, a second electrode of a last input transistor is connected to a first level, and apart from the last input transistor, a second electrode of each input transistor is connected to a first electrode of a next input transistor.

The NAND gate circuit further includes at least two pull-up modules and at least two input control transistors. A gate electrode of each input control transistor is connected to one input signal, a first electrode thereof is connected to a control end of the corresponding pull-up module, and a second electrode thereof is connected to the first level. The first electrode of the first input transistor is connected to a second level output end via the pull-up module. The input control transistor is configured to enable a potential of the control end of the pull-up module connected to the first electrode of the input transistor to be the first level when the input signal connected to the gate electrode of the input control transistor is at a second level. The at least two pull-up modules are configured to cut off the connection between the second level output end and the NAND gate output end when all the input signals are at the second level, and enable the connection between the second level output end and the NAND gate output end when none of the input signals is at the second level.

According to the NAND gate circuit of the present disclosure, the input control transistors and the pull-up modules are adopted so as to ensure lossless transmission and rail-to-rail output via the NAND gate when the input transistors are depleted TFTs, thereby to reduce the leakage current as well as improve the stability and speed of the NAND gate circuit.

In one embodiment, the at least two input transistors and the at least two input control transistors are all depleted NMOS transistors, and at this time, the first electrode is a source electrode, the second electrode is a drain electrode, the second level is a high level, and the first level is a low level.

In another embodiment, the at least two input transistors and the at least two input control transistors are all depleted PMOS transistors, and at this time, the first electrode is a drain electrode, the second electrode is a source electrode, the second level is a low level, and the first level is a high level.

For the transistors of the NAND gate circuit mentioned hereinafter, the NMOS transistors are taken as an example. A first electrode of the NMOS transistor may be a source electrode, a second electrode thereof may be a drain electrode, the second level may be a high level, and the first level may be a low level. Obviously, the PMOS transistors may also be used, and they also fall within the scope of the present disclosure.

Figure 3:
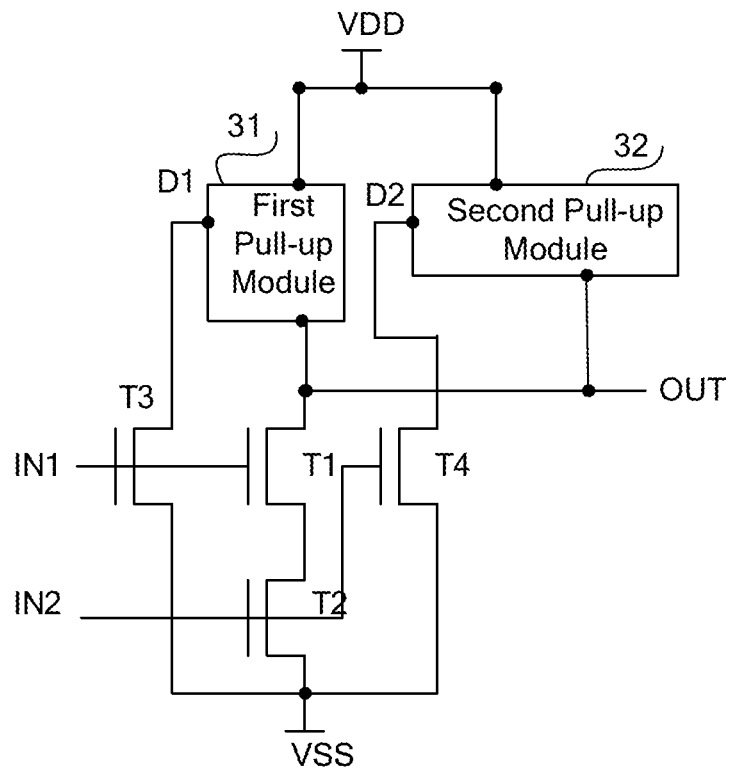
FIG. 3 is a circuit diagram of an NAND gate circuit according to one embodiment of the present disclosure.

As shown in FIG. 3, in an embodiment, the NAND gate circuit includes:

a first input transistor T1, a gate electrode of which is connected to a first input signal IN1, and a source electrode of which is connected to an NAND gate output end OUT;

a second input transistor T2, a gate electrode of which is connected to a second input signal IN2, a source electrode of which is connected to a drain electrode of the first input transistor T1, and a drain electrode of which is connected to a low level VSS:

a first input control transistor T3, a gate electrode of which is connected to the first input signal IN1, and a drain electrode of which is connected to the low level VSS; and a second input control transistor T4, a gate electrode of which is connected to the second input signal IN2, and a drain electrode of which is connected to the low level VSS.

The NAND gate circuit further includes a first pull-up module 31 and a second pull-up module 32. A source electrode of the first input control transistor T3 is connected to a control end D1 of the first pull-up module 31, and a source electrode of the second input control transistor T4 is connected to a control end D2 of the second pull-up module 32.

The source electrode of the first input transistor T1 is connected to a high level output end, which outputs a high level VDD, via the first pull-up module 31, and the source electrode of the first input transistor T1 is also connected to the high level output end via the second pull-up module 32. The first pull-up module 31 and the second pull-up module 32 are configured to cut off the connection between the high level output end and the NAND gate output end OUT when both the first input signal IN1 and the second input signal IN2 are at a high level, so as to cut off a charge current from the high level output end to the NAND gate output end OUT, thereby to enable an output signal from the NAND gate output end OUT to reach the low level VSS output by a low level output end. The first pull-up module 31 and the second pull-up module 32 are further configured to enable the connection between the high level output end and the NAND gate output end OUT when neither of the first input signal IN1 and the second input signal IN2 is at the high level, so as to enable the lossless transmission from the high level VDD to the NAND gate output end OUT.

In the NAND gate circuit of this embodiment, T1, T2. T3 and T4 are all depleted NMOS transistors. When IN1 and IN2 are both at a high level, T3 is used to control a potential of D1 to be a low level, and T4 is used to control a potential of D2 to be a low level too, so as to cut off the connection between the high level output end and OUT. When IN1 is at a high level and IN2 is at a low level, T3 is used to control the potential of D1 to be a low level while T4 is turned off, so as to achieve the lossless transmission from VDD to OUT under the control of the second pull-up module 32. When IN2 is at a high level and IN1 is at a low level, T4 is used to control the potential of D2 to be a low level while T3 is turned off, so as to achieve the lossless transmission from VDD to OUT under the control of the first pull-up module 31.

To be specific, the pull-up module includes a first pull-up transistor, a second pull-up transistor and a storage capacitor. A gate electrode of the second pull-up transistor is a control end of the pull-up module. A gate electrode of the first pull-up transistor is connected to the second level output end, a first electrode of the first pull-up transistor is connected to the gate electrode of the first pull-up transistor, and a second electrode thereof is connected to the gate electrode of the second pull-up transistor. A first electrode of the second pull-up transistor is connected to the second level output end, and a second electrode thereof is connected to the NAND gate output end. The storage capacitor is connected between the gate electrode and the second electrode of the second pull-up transistor.

During the implementation, when the input transistors and the input control transistors are depleted NMOS transistors, the first pull-up transistor and the second pull-up transistor are both depleted NMOS transistors.

During the implementation, when the input transistors and the input control transistors are all depleted PMOS transistors, the first pull-up transistor and the second pull-up transistor are both depleted PMOS transistors.

Figure 4:
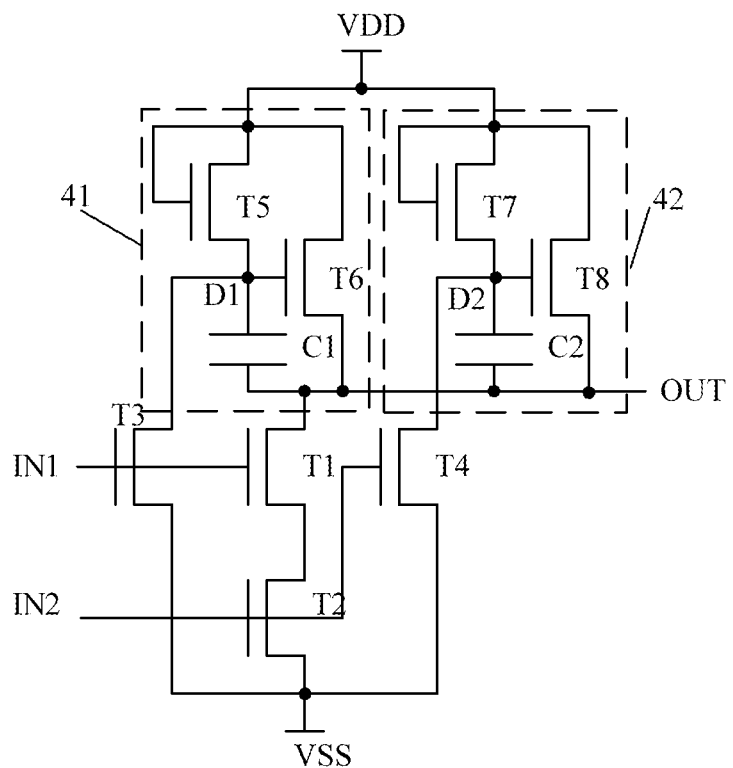
FIG. 4 is a circuit diagram of the NAND gate circuit according to another embodiment of the present disclosure.

As shown in FIG. 4, the NAND gate circuit of the present disclosure includes:

the first input transistor T1, the gate electrode of which is connected to the first input signal IN1, and the source electrode of which is connected to the NAND gate output end OUT;

the second input transistor T2, the gate electrode of which is connected to the second input signal IN2, the source electrode of which is connected to the drain electrode of the first input transistor T1, and the drain electrode of which is connected to the low level VSS:

the first input control transistor T3, the gate electrode of which is connected to the first input signal IN1, and the drain electrode of which is connected to the low level VSS;

the second input control transistor T4, the gate electrode of which is connected to the second input signal IN2, and the drain electrode of which is connected to the low level VSS;

a first pull-up module 41, a control end D1 of which is connected to the source electrode of the first input control transistor T3; and a second pull-up module 42, a control end D2 of which is connected to the source electrode of the second input control transistor T4.

The first pull-up module 41 includes:

a first pull-up transistor T5, a gate electrode and a source electrode of which are connected to the high level VDD;

a second pull-up transistor T6, a gate electrode of which is connected to a drain electrode of the first pull-up transistor T5, a source electrode of which is connected to the high level VDD, and a drain electrode of which is connected to the NAND gate output end OUT; and a first storage capacitor C1 connected between the gate electrode and the drain electrode of the second pull-up transistor T6, wherein an end point connected to the gate electrode of the second pull-up transistor T6 is the control end D1 of the first pull-up module 41.

The second pull-up module 42 includes:

a third pull-up transistor T7, a gate electrode and a source electrode of which are connected to the high level VDD;

a fourth pull-up transistor T8, a gate electrode of which is connected to a drain electrode of the third pull-up transistor T7, a source electrode of which is connected to the high level VDD, and a drain electrode of which is connected to the NAND gate output end OUT and a second storage capacitor C2 connected between the gate electrode and the drain electrode of the fourth pull-up transistor T8, wherein an end point connected to the gate electrode of the fourth pull-up transistor T8 is the control end D2 of the second pull-up module 42.

T1, T2, T3, T4, T5, T6, T7 and T8 are all depleted NMOS transistors.

During the operation of the NAND gate circuit in this embodiment, when IN1 and IN2 are both at a high level, T1 and T2 are turned on simultaneously so as to pull down the output signal, T3 and T4 are turned on too so as to pull down gate voltages of T6 and T7 to a low level, and T6 and T8 are turned off so as to cut off a charge current from the high level output end, which outputs the high level VDD, to the NAND gate output end OUT. At this time, the output signal may reach the low level VSS.

When IN1 is at a high level and IN2 is at a low level, T1 is turned on, T2 is turned off so as to cut off a pull-down path of the NAND gate output end OUT, T3 is turned on, T4 is turned off, T7, worked as a diode, is turned on, and C2 is charged by VDD through T7 so as to raise a potential at the gate electrode of T8, thereby to turn on T8 and transmit a high level to OUT. Along with an increase in a voltage of OUT, C2 is continuously charged by VDD through T7, so as to continuously raise the potential at the gate electrode of T8 until it reach a positive voltage exceeding VDD+VTH8 (a threshold voltage of T8), thereby to fully turn on T8. As a result, it is able to achieve lossless transmission of VDD from the drain electrode to the source electrode (i.e., OUT) of T8.

When IN1 is at a low level and IN2 is at a high level, T1 is turned off and T2 is turned on so as to cut off a pull-down path of the NAND gate output end, T4 is turned on, T3 is turned off, T5, worked as a diode, is turned on, and C1 is charged by VDD through T5 so as to raise a potential at the gate electrode of T6, thereby to turn on T6 and transmit a high level to OUT. Along with an increase in the voltage of OUT, the potential at the gate electrode of T6 is continuously raised by C1 until it reaches a positive voltage exceeding VDD+VTH6 (a threshold voltage of T6), thereby to fully turn on T6. As a result, it is able to achieve lossless transmission of VDD from the drain electrode to the source electrode (i.e., OUT) of T6.

Figure 2:
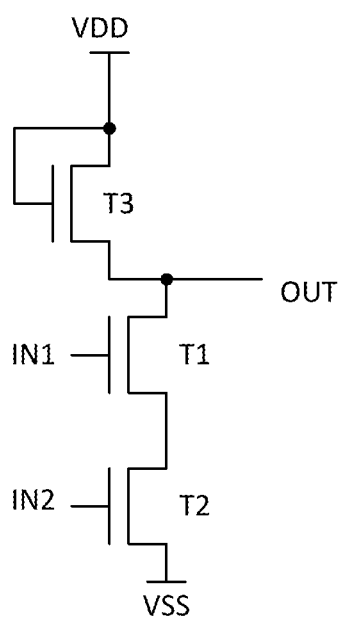
FIG. 2 is a circuit diagram of the existing NAND gate circuit including N-type transistors.

In FIG. 4, as compared with a driving transistor, T5 and T6 may be of a very small W/L (a ratio of width to length). In this way, when OUT outputs a low level, the gate electrode of T6 is at a low level, and an leakage current of T6 being in an off state is far less than an static current of T3 being in an on state in FIG. 2. In addition, due to a very small size of T5, a sum of static currents of T5 and T6 being in on states is far less than the static current of T3 being in an on state in FIG. 2 too, and as a result, the leakage current is reduced. The same condition will occur for T7, T8 and T5, T6 in FIG. 4, and thus it will not be repeated herein.

According to the NAND gate circuit of this embodiment, a capacitance bootstrapping structure consisting of eight TFTs and two capacitors is adopted, so as to achieve the rail-to-rail output and the full voltage swing, and achieve the lossless transmission, thereby to reduce the leakage current as well as improve the stability and speed of the NAND gate circuit.

The present disclosure further provides a display back plate including the above-mentioned NAND gate circuit.

The present disclosure further provides a display device including the above-mentioned display back plate.

The present disclosure further provides an electronic device including the above-mentioned NAND gate circuit.

The above are merely the embodiments of the present disclosure. It should be appreciated that, a person skilled in the art may make further improvements and modifications without departing from the principle of the present disclosure, and these improvements and modifications shall also fall within the scope of the present disclosure.

What is claimed is:

1. A NAND gate circuit, comprising at least two input transistors, a gate electrode of each input transistor being connected to an input signal, a first electrode of a first input transistor being connected to a NAND gate output end, a second electrode of a last input transistor being connected to a first level, and apart from the last input transistor, a second electrode of each input transistor being connected to a first electrode of a next input transistor, wherein
the NAND gate circuit further comprises at least two pull-up modules and at least two input control transistors,
a gate electrode of each input control transistor is connected to the input signal, a first electrode thereof is connected to a control end of the corresponding pull-up module, and a second electrode thereof is connected to the first level,
the first electrode of the first input transistor is connected to a second level output end via the pull-up module,
the input control transistor is configured to enable a potential of the control end of the pull-up module connected to the first electrode of the input transistor corresponding to the input control transistor to be the first level when the input signal connected to the gate electrode of the input control transistor is at a second level, and
the at least two pull-up modules are configured to cut off the connection between the second level output end and the NAND gate output end when all the input signals are at the second level, and enable the connection between the second level output end and the NAND gate output end when none of the input signals is at the second level,
wherein the pull-up module comprises a first pull-up transistor, a second pull-up transistor and a storage capacitor, a gate electrode of the second pull-up transistor is the control end of the pull-up module, a gate electrode of the first pull-up transistor is connected to the second level output end a first electrode of the first pull-up transistor is connected to the gate electrode of the first pull-up transistor, and a second electrode of the first pull-up transistor is connected to the gate electrode of the second pull-up transistor, a first electrode of the second transistor is connected to the second level output end, and a second electrode thereof is connected to the NAND gate output end, and the storage capacitor is connected between the gate electrode and the second electrode of the second pull-up transistor.

2. The NAND gate circuit according to claim 1, wherein the at least two input transistors and the at least two input control transistors are all depleted NMOS transistors.

3. The NAND gate circuit according to claim 2, wherein the first electrode is a source electrode, the second electrode is a drain electrode, the second level is a high level, and the first level is a low level.

4. The NAND gate circuit according to claim 1, wherein the at least two input transistors and the at least two input control transistors are all depleted PMOS transistors.

5. The NAND gate circuit according to claim 4, wherein the first electrode is a drain electrode, the second electrode is a source electrode, the second level is a low level, and the first level is a high level.

6. The NAND gate circuit according to claim 1, wherein when the input transistors and the input control transistors are all depleted NMOS transistors, the first pull-up transistor and the second pull-up transistor are both depleted NMOS transistors.

7. The NAND gate circuit according to claim 6, wherein the first electrode is a source electrode, the second electrode is a drain electrode, the second level is a high level, and the first level is a low level.

8. The NAND gate circuit according to claim 1, wherein when the input transistors and the input control transistors are all depleted PMOS transistors, the first pull-up transistor and the second pull-up transistor are both depleted PMOS transistors.

9. The NAND gate circuit according to claim 8, wherein the first electrode is a drain electrode, the second electrode is a source electrode, the second level is a low level, and the first level is a high level.

10. A display back plate, comprising the NAND gate circuit according to claim 1.

11. A display device, comprising the display back plate according to claim 10.

12. An electronic device, comprising the NAND gate circuit according to claim 1.

13. The electronic device according to claim 12, wherein the at least two input transistors and the at least two input control transistors are all depleted NMOS transistors.

14. The electronic device according to claim 13, wherein the first electrode is a source electrode, the second electrode is a drain electrode, the second level is a high level, and the first level is a low level.

15. The electronic device according to claim 12, wherein the at least two input transistors and the at least two input control transistors are all depleted PMOS transistors.

16. The electronic device according to claim 15, wherein the first electrode is a drain electrode, the second electrode is a source electrode, the second level is a low level, and the first level is a high level.

17. The electronic device according to claim 12, wherein when the input transistors and the input control transistors are all depleted NMOS transistors, the first pull-up transistor and the second pull-up transistor are both depleted NMOS transistors.

18. The electronic device according to claim 17, wherein the first electrode is a source electrode, the second electrode is a drain electrode, the second level is a high level, and the first level is a low level.

19. A NAND gate circuit receiving a plurality of input signals and generating an output signal at an output terminal, the NAND gate circuit comprising:
- a plurality of input transistors, wherein:
  - for each input transistor of the plurality of input transistors, a gate terminal of the input transistor receives a respective one of the plurality of input signals, and
  - the plurality of input transistors are connected in series between the output terminal and a first reference potential;
- a plurality of input control transistors, wherein for each input control transistor of the plurality of input control transistors, a gate terminal of the input control transistor receives a respective one of the plurality of input signals; and
- a plurality of pull-up modules, wherein for each pull-up module of the plurality of pull-up modules:
  - the pull-up module includes a first pull-up transistor, a second pull-up transistor, and a capacitor,
  - the first pull-up transistor is connected between a control end of the pull-up module and a second reference potential,
  - the capacitor is connected between the control end and the output terminal,
  - the second pull-up transistor is connected between the second reference potential and the output terminal,
  - a gate terminal of the first pull-up transistor is connected to the second reference potential,
  - a gate terminal of the second pull-up transistor is connected to the control end, and
  - a corresponding one of the plurality of input control transistors is connected between the control end and the first reference potential.

20. The NAND gate circuit of claim 19, wherein:
the plurality of input transistors and the plurality of input control transistors are depleted NMOS transistors;
for each of the plurality of pull-up modules, the first pull-up transistor and the second pull-up transistor are depleted NMOS transistors;
the first reference potential is a low potential; and
the second reference potential is a high potential.

* * * * *